INVENTOR.
EARLE B. Mc DOWELL
BY
HIS ATTORNEY

Feb. 25, 1969 E. B. McDOWELL 3,430,106

DIFFERENTIAL LIGHT RESPONSIVE CIRCUITS WITH A SOLAR CELL CONNECTED BETWEEN THE INPUTS OF THE AMPLIFIERS

Filed June 16, 1965 Sheet 2 of 2

INVENTOR.
EARLE B. Mc DOWELL

BY W. J. Shanley Jr.
HIS ATTORNEY

United States Patent Office 3,430,106
Patented Feb. 25, 1969

3,430,106

DIFFERENTIAL LIGHT RESPONSIVE CIRCUITS WITH A SOLAR CELL CONNECTED BETWEEN THE INPUTS OF THE AMPLIFIERS

Earle B. McDowell, Waynesboro, Va., assignor to General Electric Company, a corporation of New York Filed June 16, 1965, Ser. No. 464,290
U.S. Cl. 317—130 11 Claims
Int. Cl. H01h *47/24, 47/32*

ABSTRACT OF THE DISCLOSURE

A differential amplifier with zero output adjustment substantially eliminates leakage current problems normally encountered with single ended amplifiers used for photoelectric cell amplification. The cell is connected between the base electrodes of the two transistors of the differential amplifier.

Figure 1:
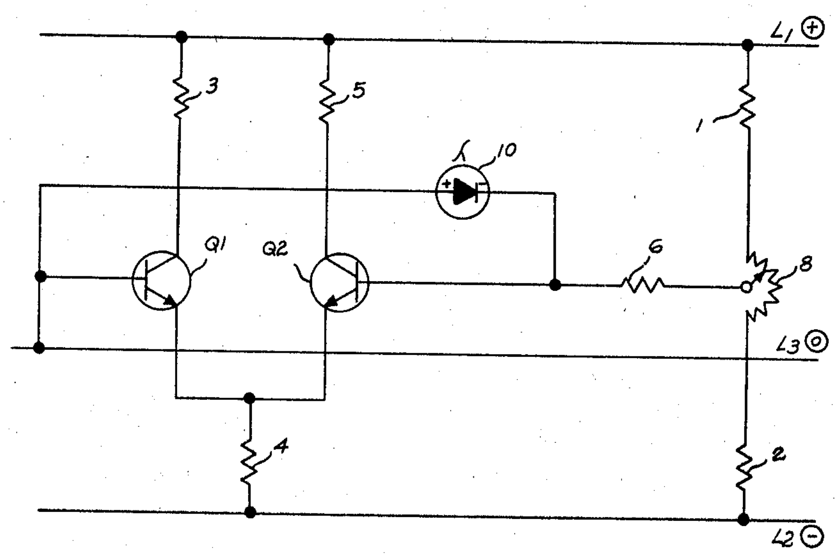

The present invention relates to control circuits and more specifically to light responsive control circuits capable of operating at low signal levels.

It is well-known that the P-N or N-P junction semiconductor light sensitive cell can be operated as an energy converter in which light striking the sensitive junction causes a voltage to be generated and a current to flow into a load resistance connected to its output terminals. These cells are commonly referred to as photovoltaic cells. One well-known form of this type cell is the solar energy converter called the solar cell. Hereinafter the light sensitive device which is the subject of this invention will be referred to as a solar cell.

When light impinges on the junction of a solar cell of the type processed from silicon, the current flowing into its load is substantially constant from short circuit to some limiting value which depends upon the cell's voltage current characteristics. The cell also exhibits a proportional relationship between illumination and load current when the proper load is applied. Because of these characteristics the cell is commonly referred to as a constant current generator. A reverse bias voltage may be applied to the cell in series with its load resistance to extend the range of resistance over which a proportional relationship between illumination and generated current can be obtained. Similarly, a reverse bias voltage also serves to extend the range of illumination over which the proportional relationship with generated current can be obtained for a given load resistance.

When a reverse bias voltage is applied to the cell a small current, referred to as dark leakage current, flows under no illumination condition. In applications where the generated current resulting from the cell illumination is large compared to its dark leakage current, the error produced by this dark leakage current can be considered to be negligible. However, when the illumination applied to the cell is low enough so that the generated current is not large compared to the dark leakage current, appreciable variations in cell output can occur as the leakage current varies due to temperature or due to other reasons.

Therefore, when using this cell to drive an amplifier it would be desirable that no bias voltage would be added to the cell by the amplifier circuit, and the load resistance presented by the amplifier would be low enough to provide a proportional relationship between illumination and generated voltage over the desired range of illumination. With no bias voltage dark leakage current would not exist and the cell would be operated at low light levels without the possibility of error which could be introduced by variation in leakage current. It would also be desirous to have an amplifier circuit wherein the solar cell is connected between a pair of identical elements so that if these elements have identical temperature characteristics there will be no change in the bias condition on the cell when the temperature of the amplifier is varied.

Therefore, one object of the present invention is to provide a solar cell circuit which maintains a substantially zero bias across the solar cell while at the same time a low input impedance is presented to the solar cell.

Another object of the present invention is to provide a temperature compensated solar cell circuit.

Another object of the present invention is to provide a solar cell circuit capable of operation at low signal levels.

Another object of the present invention is to provide a solar cell circuit wherein a zero bias voltage across a solar cell can be set for any given light condition.

Still another object of the present invention is to provide an amplifier circuit connected to the solar cell in which an adjustable bias current can be applied to the input so as to vary the amplifier output for any initial illumination on the cell.

Briefly, in the present invention a solar cell is connected between the two inputs of a differential amplifier. With no light on the solar cell or for a given light condition, the current through the amplifier is adjusted so that the differential voltage between the outputs is zero. When the characteristics of the two amplifying elements of the differential amplifier are identical, there will be zero voltage between these two inputs when the outputs are zero and no bias voltage will be applied to the cell. However, if these amplifying elements are of the semiconductor type such as transistors and proper circuit parameters are chosen, the bias presented to the cell with a moderate unbalance of the outputs is usually small enough so that the resulting leakage current is negligible. With a change in light condition of the cell the differential output voltage also changes. The output is connected for direct control of an appropriate element or can be connected for further amplification.

Additional objects and advantages of the present invention together with a better understanding thereof may be had by referring to the following detailed description of the preferred embodiment of the present invention along with the accompanying drawings:

FIG. 1 reveals a schematic diagram of a first embodiment of the present invention.

Figure 2:
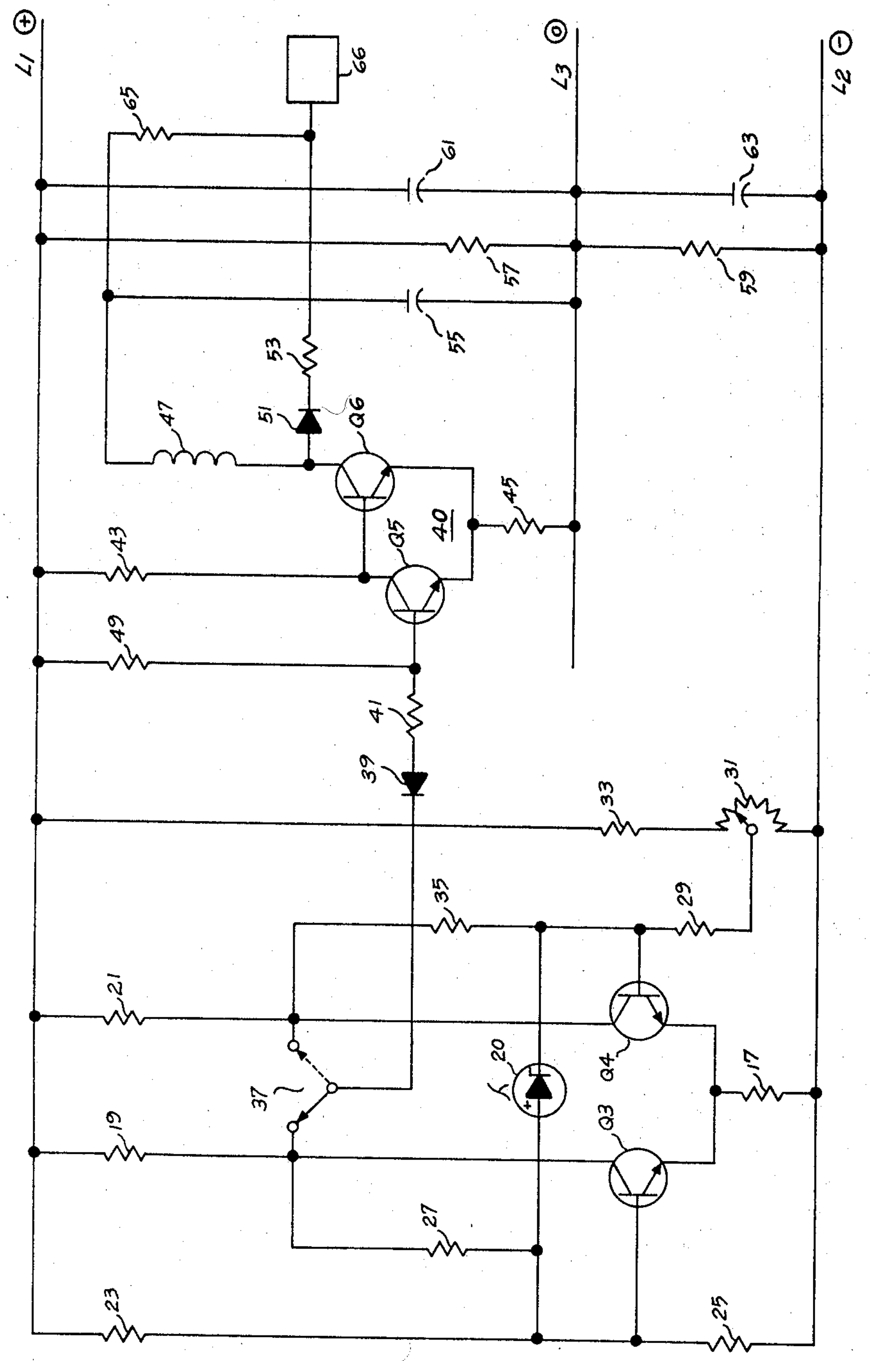

FIG. 2 reveals a schematic diagram of a relay circuit incorporating the present invention.

Figure 3:
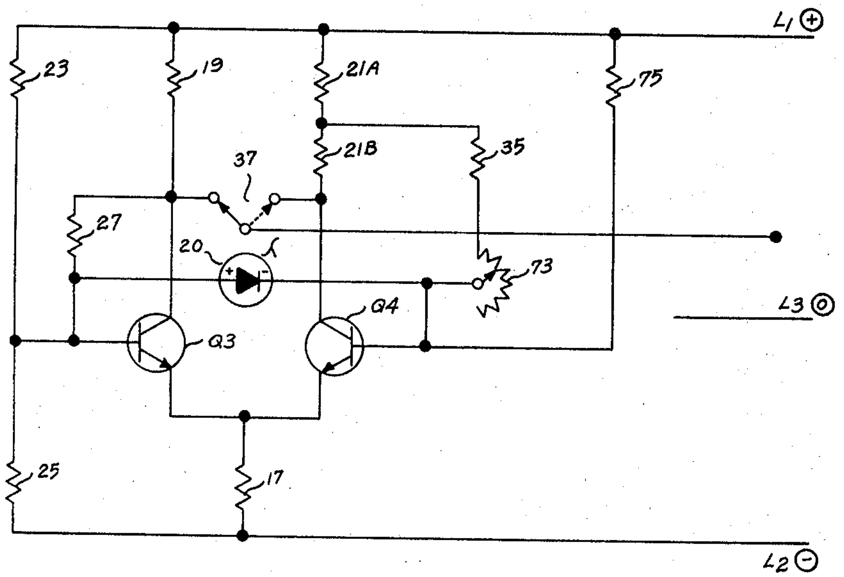

FIG. 3 reveals a schematic diagram of an alternative embodiment of the present invention.

Referring now to FIG. 1 and the first embodiment of the present invention, there is shown a differential amplifier between the inputs of which a solar cell is connected. Specifically, the differential amplifier comprises a first transistor Q1 having its collector connected through a load resistor 3 to a source of positive supply voltage L1 and its emitter connected through a bias resistor 4 to a source of negative supply voltage L2. The base of transistor Q1, or first input of the differential amplifier, is connected to a zero potential reference L3 and is also connected to one side of a solar cell 10. The differential amplifier also includes a second transistor Q2 having its collector connected through a load resistor 5, equal in resistance to resistor 3, to the source of positive voltage L1 and its emitter connected through the bias resistor 4 to the source of negative voltage L2. The base of transistor Q2, or the second input to the differential amplifier, is connected to the opposite end of the solar cell 10. The second input to the differential amplifier is also connected through a current limiting resistor 6 to a voltage divider network including resistors 1 and 2 between which an adjustable potentiometer 8 is connected. It is this potentiometer 8 that is used for adjusting the conduction state of transistors Q1 and Q2 so that for a given illumination condition on the solar cell 10, the collector currents of transistors Q1 and Q2 can be set at a value which will result in zero voltage or a very low voltage being applied to the cell. The output of the differential amplifier may be taken from either the collector of transistor Q1 or the collector of transistor Q2 or between the two collectors.

In the operation of the circuit of FIG. 1, with no light falling on the solar cell the potentiometer 8 is adjusted until the currents flowing in load resistors 3 and 5 are identical. When this occurs, there is substantially zero voltage across the light cell due to the substantially identical base to emitter voltage-current relationships of the two transistors. When light is applied to the solar cell 10, current is caused to flow from the base of transistor Q2 to the base of transistor Q1 thus raising the collector voltage of transistor Q2 and lowering the collector voltage of transistor Q1. This results in a voltage differential occurring between the collectors of the two transistors which change in voltage differential is proportional to the change in illumination falling on the solar cell 10. Note that this voltage is maintained substantially independent of temperature because the transistors Q1 and Q2 are identical and therefore the temperature characteristics of both the transistors should be identical.

If it is desired to energize a relay when an increase in light is applied to the solar cell the voltage change of collector of transistor Q1 when applied to a suitable amplifier can perform this function. By applying the voltage from collector of transistor Q2 to the same amplifier the relay could be energized with a decrease in light on the cell.

Control of other circuits may also be accomplished by using the differential voltage appearing between the collectors of transistors Q1 and Q2 as an input to a control circuit.

It is also noted that potentiometer 8 provides a means for adjusting the bias current to the base of transistor Q2 so that for any given light condition occurring in the circuit, the collector currents through transistors Q1 and Q2 can be adjusted to a balanced or unbalanced condition for the purpose of establishing a reference point for any light level within the range of the amplifier characteristics.

Turning now to the photorelay circuit revealed in FIG. 2, there is shown a differential amplifier including two transistors Q3 and Q4 with each transistor providing an input and an output for the differential amplifier. Specifically, the first transistor Q3 has its emitter connected through the bias resistor 17 to the source of negative voltage L2 and its collector connected through a load resistor 19 to the source of positive voltage L1. Similarly, the second transistor Q4 has its emitter connected through the bias resistor 17 to the source of negative voltage L2 and its collector connected through a load resistor 21, equal in resistance to resistor 19, to the source of positive voltage L1. A resistive divider network is connected between the positive L1 and negative L2 sources of voltage and includes resistors 23 and 25 the junction of which is connected to the base or input of transistor Q3. A negative feedback resistor 27 is connected between the collector and base of transistor Q3 and is used to stabilize the gain as well as to match the voltage-current characteristics of the amplifier to the voltage-current characteristics of the solar cell 20. The solar cell 20 is connected between the inputs, or bases, of the two transistors Q3 and Q4 and provides means for generating a current input signal to the differential amplifier. The base of transistor Q4 is also connected through a current limiting resistor 29 to the slider arm of a potentiometer 31 which has one end connected to the source of negative voltage L2 and its opposite end connected through a resistor 33 to a source of positive voltage L1. The purpose of the potentiometer-resistor network is to provide means for adjusting the collector currents of transistors Q3 and Q4 for various initial light conditions of the solar cell. A negative feedback resistor 35 is also connected between the collector and base of transistor Q4 and likewise aids in the matching of the voltage-current characteristics of the amplifier to the voltage-current characteristics of the solar cell. A selector switch 37 is provided for connecting either the collector of transistor Q3 or collector of transistor Q4, which comprises the outputs of the differential amplifier, to the remainder of the photorelay circuit so that a relay coil 47 may be energized for either an increase or decrease in the light falling on the solar cell. As the gain of the amplifier is constant for given feedback resistors 27 and 35 and as the potentiometer 31 is used only for adjusting the circuit for a given reference light level applied to the cell and has no effect on the gain of the circuit, the differential light level required to produce a given output voltage remains constant. As a result thereof, for greater values of light reference levels, the percent of light change to produce a given output of the amplifier becomes less.

Returning to the photorelay circuit of FIG. 2, there is shown a second amplifier 40 the output of which is connected to the relay coil 47 to be controlled and the input of which is connected to either of the outputs of the differential amplifier. Specifically, the amplifier 40 comprises a diode 39 connected to the selector switch 37 which in turn is connected through an input resistor 41 to the input of the amplifier. The amplifier 40 includes a first transistor Q5, the base of which is the input of the amplifier 40, the collector of which is connected through a load resistor 43 to the source of positive voltage L1 and the emitter of which is connected through a bias resistor 45 to the zero reference L3. The collector of the input transistor Q5 is also connected to the input of a second transistor Q6 the collector of which is connected through the relay coil 47 and through a limiting resistor 65 to a separate source of positive voltage 66 which may or may not be at the same potential level as the source of positive voltage L1. A resistor 49 is connected between the source of positive voltage L1 and the base to the transistor Q5 and is used for controlling the initial conducting states of the amplifier transistors.

With no signal from the differential amplifier, resistor 49 holds Q5 conducting and Q6 nonconducting due to the flow of current to the collector of transistor Q5 rather than to the base of transistor Q6. With a negative signal from the differential amplifier, due to an increase or decrease in illumination on the light cell, conduction of transistor Q5 is decreased. This decrease in conduction of transistor Q5 is accompanied by a flow of current into the base of transistor Q6 which initiates conduction of its collector current. Since the collector currents of both transistors Q5 and Q6 flow through resistor 45 and the current of transistor Q6 is much greater than that of transistor Q5, the voltage across resistor 45 increases in potential and acts to further reduce the collector current of transistor Q5. Once this regenerative action is initiated by a small decrease in collector current of transistor Q5, its current is rapidly reduced to zero and collector current of transistor Q6 is rapidly increased to its maximum saturated value. This increase in conduction of transistor Q6 energizes the coil of relay 47.

The source of voltage for the relay 47 comprises the output of a full wave rectifier 66. A diode 51 is connected to the collector of transistor Q6 and through a current limiting resistor 53 to the output of the full wave rectifier 66 for protecting the amplifier from inductive kickback from the relay 47 when it deenergizes. A filter capacitor 55 is connected across the DC supply for the full wave rectified supply for the control relay 47.

Resistor and capacitor voltage dividing networks are used to maintain the value of the positive voltage L1, the zero reference L3, and the negative voltage L2. Specifically, resistors 57 and 59 and capacitors 61 and 63 form this voltage dividing network.

Briefly, in one mode of operation with switch 37 positioned as shown and with no light falling on the light cell 20, the potentiometer is set so that the differential base current of transistors Q3 and Q4 produces a potential at the collector of transistor Q3 which is of a sufficient positive value with respect to reference potential L3 to maintain conduction of transistor Q5 and nonconduction of Q6. When light impinges on the cell 20, current increases in the base of transistor Q3 and decreases in the base of transistor Q4, which causes the collector potential of transistor Q3 to be reduced to a level where the collector current of transistor Q5 is reduced and the regenerative action of transistors Q5 and Q6 takes place as described heretofore. The resulting increase in conduction of transistor Q6 energizes relay 47. The operation of the relay 47 with respect to light decrease can be obtained by transferring switch 37 so as to connect the input of relay circuit 40 to the collector of transistor Q4.

Referring now to FIG. 3, there is shown a solar cell input amplifier circuit somewhat similar to that revealed in FIG. 2. Specifically, there is included a differential amplifier having transistors Q3 and Q4 connected through load resistors 19, 21, bias resistor 17, and voltage divider resistors 23 and 25 exactly as described in FIG. 2. However, load resistor 21 has been split into two sections 21A and 21B. Again, negative feedback resistors 27 and 35 are provided and the solar cell 20 is connected between the bases of the transistors Q3 and Q4. The selector switch 37 is connected to selectively connect the collectors of transistors Q3 or Q4 to an output circuit. However, whereas the control potentiometer 31 in FIG. 2 had the single purpose of adjusting the currents through the transistors for the initial condition, the circuit of FIG. 3 provides an adjustable resistor 73 connected in series with the negative feedback resistor 35 for performing a dual function. The adjustable resistor 73 is used for both current adjustment as well as controlling the amount of negative feedback to the transistor. Specifically, the load resistor 21 is split into two sections 21A and 21B and the feedback resistor 35 in series with adjustable resistor 73 is connected to this junction.

When the illumination of the light cell is changed to a higher value, it is necessary to reduce the resistance of adjustable resistor 73, thereby increasing the flow of current to the base of transistor Q4, in order to establish the proper initial reference levels of the collectors of transistors Q3 and Q4. When this current adjustment is made it also increases the feedback between collector and base of transistor Q4, thereby reducing the gain of the amplifier.

With the foregoing circuit it is possible to have a circuit responsive to a constant percentage of light level rather than a constant differential in light level. This requires that the current gain of the amplifier be reduced proportionally as the light reference level increases. The circuit of FIG. 3 is such an example.

While I have shown and described a preferred embodiment of the present invention, it will be obvious to those skilled in the art that various changes and modifications may be made without departing from the present invention in its broader aspect and therefore it is the intention of the appended claims to cover all such changes and modifications as fall within the true spirit and scope of the present invention.

What I claim as new and desire to secure by Letters Patent of the United States is:

1. A light responsive control circuit comprising a differential amplifier having first and second outputs and corresponding first and second inputs, light responsive means for generating signal currents in response to variations in incident light, means for connecting said light responsive means between said first and second inputs, means coupled to said first and second input for adjusting currents supplied thereto so that for a given amount of illumination on said light repsonsive means there will be substantially zero voltage across said light responsive means, and means connected to said first and second outputs for deriving an output signal from said differential amplifier which is responsive to variations of illumination on said light responsive means.

2. A light responsive control circuit as described in claim 1 wherein said adjusting means includes a potentiometer connected to one of said inputs and adjustable to vary the current supplied thereto.

3. A light responsive control circuit as described in claim 1 further comprising negative feedback means between said first output and said first input and also between said second output and said second input, said negative feedback means reducing the gain of said differential amplifier such that the input impedances of said differential amplifier is reduced.

4. A light responsive control circuit as described in claim 1 wherein said signal deriving means includes a second amplifier, and a relay coil connected in series to the output of said second amplifier and being responsive to an output signal from said differential amplifier for operation thereof.

5. A light responsive control circuit as described in claim 3 wherein said adjusting means includes a potentiometer connected to the second of said inputs and adjustable to vary the current supply to the second of said inputs.

6. A light responsive control circuit comprising a differential amplifier having first and second inputs and first and second outputs, light responsive means for generating signal currents in response to variations in incident light, means for connecting said light responsive means between said first and second inputs, means for supplying a constant value current to said first input, negative feedback means connected between said first output and said first input and between said second output and second input for reducing the gain of said differential amplifiers such that the input impedance of said differential amplifier is reduced, and means for controlling the feedback between said second output and said second input, said means also varying the amount of current supplied to said second input of the differential amplifier.

7. A light responsive control circuit as described in claim 6 wherein said controlling means includes an adjustable resistor connected to said feedback means between said second output and second input.

8. A light responsive control circuit as described in claim 6 further including means for supplying a constant value current to said second input.

9. A light responsive control circuit comprising a differential amplifier having first and second inputs and first and second outputs, a light responsive cell connected between said first and second inputs and responsive to illumination, means for supplying a constant value current to said first input, negative feedback means connected between said first output and said first input, negative feedback means connected between two load resistors in series with said second output and said second input, means for controlling the feedback between said second output and said second input, said means also varying the amount of current supplied to said second input of the differential amplifier.

10. A light responsive control circuit as described in claim 9 wherein said controlling means includes an adjustable resistor connected to said feedback means between said second output and second input.

11. A light responsive control circuit as described in claim 9 further including a second amplifier, and a relay coil connected in series to the output of said second amplifier and being responsive to an output signal from said differential amplifier for operation thereof.

References Cited

UNITED STATES PATENTS

| | | | |
|---|---|---|---|
| 2,259,323 | 10/1941 | Peterman | 330—59 |
| 3,189,745 | 6/1965 | Van Reymers et al. | 250—214 |
| 3,317,671 | 5/1967 | Mitchell et al. | 330—14 |

ROBERT SEGAL, *Primary Examiner.*

C. R. CAMPBELL, *Assistant Examiner.*

U.S. Cl. X.R.

250—206, 214; 307—311; 315—158, 159; 317—148.5